US006960262B2

(12) United States Patent
Sasaki et al.

(10) Patent No.: US 6,960,262 B2
(45) Date of Patent: Nov. 1, 2005

(54) THIN FILM-FORMING APPARATUS (75) Inventors: Koji Sasaki, Kanagawa (JP); Hironobu Narui, Kanagawa (JP); Katsunori Yanashima, Kanagawa (JP); Akihiko Memezawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/486,801

(22) PCT Filed: Jun. 17, 2003

(86) PCT No.: PCT/JP03/07669

§ 371 (c)(1),
(2), (4) Date: Feb. 13, 2004

(87) PCT Pub. No.: WO03/106730

PCT Pub. Date: Dec. 24, 2003

(65) Prior Publication Data

US 2004/0194702 A1    Oct. 7, 2004

(30) Foreign Application Priority Data

Jun. 17, 2002 (JP) .............................. 2002-175291
Oct. 7, 2002 (JP) .............................. 2002-293280

(51) Int. Cl.[7] ...................... C23C 16/00; C23C 16/455
(52) U.S. Cl. ................... 118/715; 156/345.33
(58) Field of Search .................. 118/715; 156/345.33, 156/345.34

(56) References Cited

U.S. PATENT DOCUMENTS

| | | | | |
|---|---|---|---|---|
| 3,511,703 A | * | 5/1970 | Peterson ..................... 438/778 |
| 4,413,022 A | * | 11/1983 | Suntola et al. ................. 117/89 |
| 4,848,273 A | * | 7/1989 | Mori et al. ................... 118/729 |
| 4,993,360 A | * | 2/1991 | Nakamura .................... 118/719 |
| 5,445,699 A | * | 8/1995 | Kamikawa et al. ....  156/345.24 |
| 6,359,388 B1 | * | 3/2002 | Petrmichl .............. 315/111.81 |
| RE38,358 E | * | 12/2003 | Petrmichl .............. 315/111.81 |
| 2004/0134428 A1 | * | 7/2004 | Sasaki et al. ............... 118/715 |
| 2004/0194702 A1 | * | 10/2004 | Sasaki et al. ............... 118/715 |

FOREIGN PATENT DOCUMENTS

| | | | |
|---|---|---|---|
| JP | 61-101020 | * | 5/1986 |
| JP | 62-093922 | * | 4/1987 |
| JP | 63-162596 | * | 7/1988 |
| JP | 63-257232 | * | 10/1988 |
| JP | 04-198483 A | | 7/1992 |
| JP | 11-323532 A | | 11/1999 |
| WO | WO 99/25894 A1 | | 5/1999 |

* cited by examiner

Primary Examiner—Jeffrie R. Lund
(74) Attorney, Agent, or Firm—Robert J. Depke; Trexler, Bushnell, Giangiorgi, Blackstone & Marr (57) ABSTRACT

A thin film formation apparatus by which source gas is supplied uniformly to the surface of a substrate so that an organic thin film of a uniform film thickness can be formed on the surface of the substrate. The thin film formation apparatus includes a vacuum chamber (11), a substrate holder (12) provided in the vacuum chamber (11), and a gas supplying end element (22) for supplying gas toward a substrate mounting face (12a) of the substrate holder (12). The gas supplying end element (22) is formed so as to supply the source gas in an elongated rectangular shape to the substrate mounting face (12a).

10 Claims, 6 Drawing Sheets

THIN FILM-FORMING APPARATUS

This application claims priority to Japanese Patent Application Number JP2002-175291, filed Jun. 17, 2002, and Japanese Patent Application Number JP2002-293280, filed Oct. 7, 2002 which are incorporated herein by reference.

TECHNICAL FIELD

This invention relates to a thin film formation apparatus, and more particularly to a thin film formation apparatus applied to organic vapor phase deposition wherein source gas is supplied together with carrier gas to a surface of a substrate in a vacuum chamber.

BACKGROUND ART

An organic thin film for an organic EL display device or a low-molecular type organic EL light emitting device such as an organic semiconductor laser is usually formed by vacuum vapor deposition.

Figure 7:
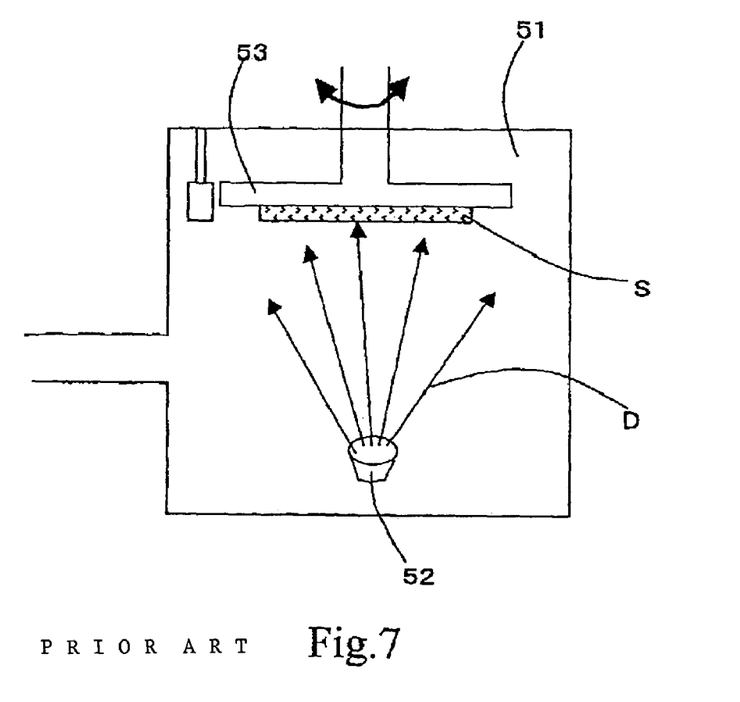
FIG. 7 is a schematic view showing a vacuum vapor deposition apparatus according to a related art.

As shown in FIG. 7, a vacuum vapor deposition apparatus for use with vacuum vapor deposition includes a vacuum chamber 51, a vapor source 52 provided at a bottom portion in the vacuum chamber 51, and a substrate holder 53 disposed in an opposing relationship above the vapor source 52.

In order to form an organic thin film on the surface of a substrate S using such an apparatus as just described, the substrate S is mounted on the substrate holder 53 with the surface thereof directed downward. Then, while the surface of the substrate S is covered with a mask (not shown), organic raw material is heated to evaporate from the vapor source 52 in the vacuum chamber 51 in high vacuum of $10^{-3}$ to $10^{-4}$ Pa. Consequently, the organic raw material is vapor-deposited on the surface of the substrate S as indicated by arrow marks D in a state wherein the source gas is diffused sufficiently within the vacuum chamber 51.

Meanwhile, in recent years, as an apparatus for forming an organic thin film, an organic vapor phase deposition apparatus based on organic vapor phase deposition (OVPD) has been proposed (PCT International Publication for patent application Ser. No. 2001-523768).

The organic vapor phase deposition apparatus includes a vacuum chamber, a substrate holder provided in the vacuum chamber, and a gas supplying apparatus disposed for supplying gas into the vacuum chamber. Source gas is supplied together with carrier gas to the surface of a substrate mounted on the substrate holder within the vacuum chamber under a decompressed atmosphere to form an organic thin film on the surface of the substrate.

Where such a vacuum vapor deposition apparatus and an organic vapor phase deposition apparatus as described above are used to form an organic thin film, if an organic thin film is formed while the substrate is in a stationary state, then the source gas cannot be deposited uniformly on the surface of the substrate, but the film thickness of the organic thin film formed becomes ununiform. Therefore, a rotating mechanism or a sliding mechanism is provided for the substrate holder to adjust the film thickness distribution.

However, since, in the vacuum vapor deposition apparatus, source gas evaporated from a vapor source within the vacuum chamber is supplied in a diffused state toward the substrate disposed above the vapor source, even if a rotating mechanism or a sliding mechanism is provided for the substrate, there is a tendency that the source gas is likely to be supplied to a central portion rather than end portions of the substrate.

Meanwhile, in the organic vapor phase deposition apparatus, since source gas is supplied in a vapor phase state into the vacuum chamber, the source gas supplied through a gas supply port is likely to flow along the shortest path toward an exhaust port. Therefore, in order to supply the material gas uniformly to the surface of the substrate, it is necessary to move the substrate mounting face with respect to the gas supply port taking the flowing direction of the source gas into consideration.

Accordingly, a thin film formation apparatus is demanded by which source gas is supplied uniformly to the surface of a substrate so that an organic thin film of a uniform film thickness can be formed on the surface of the substrate.

DISCLOSURE OF INVENTION

In order to solve such a subject as described above, according to the present invention, there is provided a thin film formation apparatus which includes a vacuum chamber, a substrate holder provided in the vacuum chamber, and a gas supplying end element for supplying gas toward a substrate mounting face of the substrate holder, characterized in that the gas supplying end element is formed so as to supply the gas in an elongated rectangular shape to the substrate mounting face.

With the thin film formation apparatus, since the gas supplying end element is formed so as to supply the gas in an elongated rectangular shape to the substrate mounting face, the gas is supplied in an elongated rectangular shape to the surface of a substrate mounted on the substrate mounting face.

Further, where the substrate holder includes a sliding mechanism for moving the substrate mounting face of the substrate holder in a direction of a shorter side of the supplying range of the gas which has the elongated rectangular shape, by slidably moving the substrate mounting face in the direction of the shorter side when the gas is supplied, the gas supplied in an elongated rectangular shape can be supplied while it is scanned in the direction of the shorter side on the surface of the substrate. Consequently, gas formed from film formation components can be deposited uniformly in the surface region of the substrate, and a thin film having a uniform film thickness can be formed.

On the other hand, where a plurality of gas supplying end elements are disposed parallelly in a direction of a shorter side of the supplying range of the gas which has the elongated rectangular shape, the gas supplied in an elongated rectangular shape from the gas supply ports to the surface of the substrate can be supplied over the shorter side direction. Consequently, even where the substrate remains in a stationary state, gas formed from film formation components can be deposited uniformly in the surface region of the substrate and a thin film having a uniform film thickness can be formed.

BEST MODE FOR CARRYING OUT THE INVENTION

In the following, embodiments of a thin film formation apparatus of the present invention are described with reference to the drawings.

First Embodiment

Figure 1A:
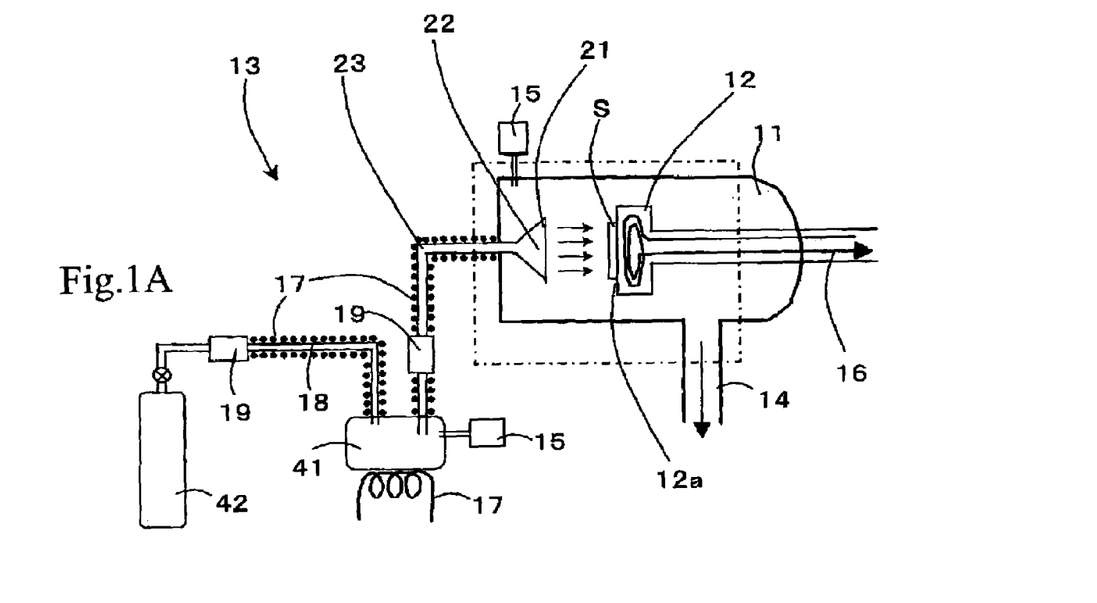
FIG. 1A is a schematic view showing a thin film formation apparatus according to a first embodiment.
Figure 1B:
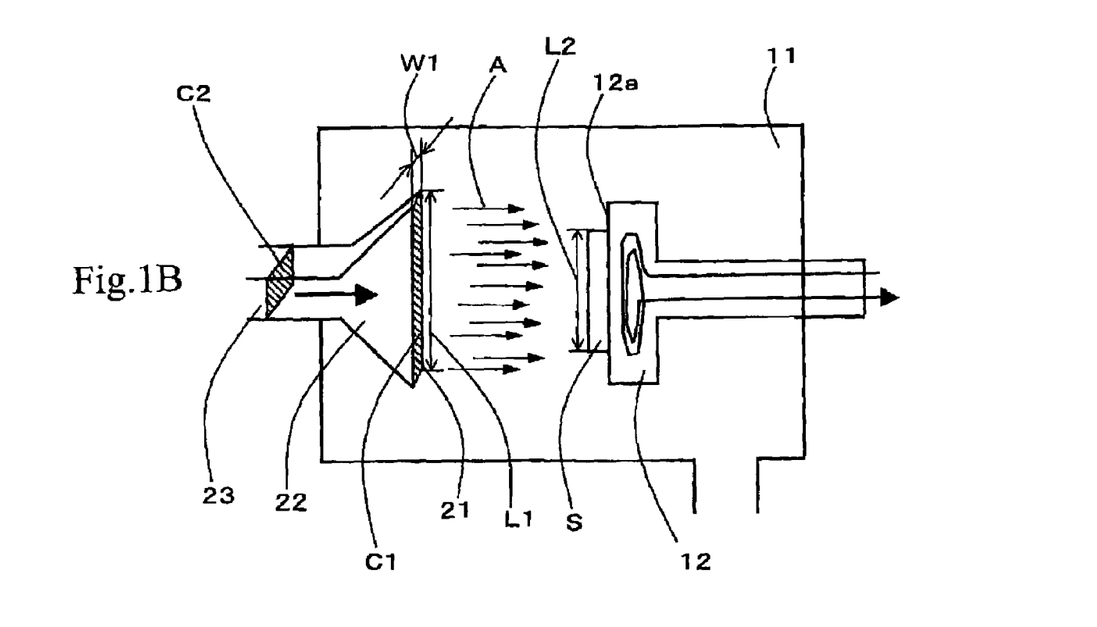
FIG. 1B is a partial enlarged view of the thin film formation apparatus.

FIGS. 1A and 1B are schematic views showing an embodiment of an organic vapor phase deposition apparatus which is a thin film formation apparatus of the present invention.

The organic vapor phase deposition apparatus shown in the figures is configured such that a mask (not shown) is disposed in a vacuum chamber 11 kept in a decompressed atmosphere in such a manner as to cover a substrate S and an organic thin film of a predetermined pattern is formed on the substrate S through the mask.

The organic vapor phase deposition apparatus includes the vacuum chamber 11, a substrate holder 12 provided in the vacuum chamber 11, and a gas supplying end element 22 for supplying gas toward a substrate mounting face 12a of the substrate holder 12.

The internal environment (for example, a decompressed state) of the vacuum chamber 11 is controlled by a vacuum pump not shown through an exhaust port 14 for exhausting surplus source gas therethrough, and the pressure in the vacuum chamber 11 is managed by a pressure gage 15.

Further, for example, a heater (not shown) is provided in the vacuum chamber 11 so that the source gas in the vacuum chamber 11 may maintain a vapor phase state.

The substrate holder 12 provided in the vacuum chamber 11 is disposed such that the substrate mounting face 12a thereof extends substantially perpendicularly to the horizontal state, and the substrate mounting face 12a is configured such that a substrate S covered with a mask is mounted thereon.

A sliding mechanism (not shown) for slidably moving the substrate mounting face 12a within a plane thereof is provided for the substrate holder 12. Here, the substrate mounting face 12a is moved back and forth horizontally in directs to the depth and to the front of the figures by the sliding mechanism.

A cooling mechanism 16 for cooling the substrate S mounted on the substrate holder 12 is provided for the substrate holder 12.

Now, a gas supplying apparatus 13 in the present embodiment is described.

The gas supplying apparatus 13 includes a source gas supply source 41, a gas supply pipe 23 connected at an end thereof to the source gas supply source 41, and a gas supplying end element 22 connected to the other end of the gas supply pipe 23.

Organic raw material for forming an organic thin film, for example, on the surface of the substrate S is reserved in the source gas supply source 41, and a heater 17 for evaporating the organic raw material is provided on the outer side of the source gas supply source 41. Further, the pressure gage 15 is provided for the source gas supply source 41 to manage the pressure in the inside of the source gas supply source 41.

A pipe 18 connected to a carrier gas supply source 42 is inserted in the source gas supply source 41, and inert gas to be used as carrier gas is reserved in the carrier gas supply source 42.

Here, for example, inert gas such as $N_2$, He or Ar is used as the carrier gas. However, the present invention is not limited to this, and any gas may be used only if it does not react with the source gas and may be, for example, $H_2$ or the like.

The carrier gas is introduced from the pipe 18 into the source gas supply source 41 and mixed with the source gas in the source gas supply source 41.

The circumference of the pipe 18 is covered with the heater 17 such that heated carrier gas may be supplied to the source gas supply source 41.

Further, a gas flow rate control apparatus 19 is provided for the pipe 18 and can regulate the flow rate of the carrier gas.

The gas supply pipe 23 is connected at an end thereof to the source gas supply source 41. The circumference of the gas supply pipe 23 is covered with the heater 17 such that the source gas mixed with the carrier gas may be supplied from the source gas supply source 41 into the vacuum chamber 11 while it maintains the vapor phase state.

Another gas flow rate control apparatus 19 is provided for the gas supply pipe 23 and can regulate the flow rate of the source gas mixed with the carrier gas.

The gas supply pipe 23 is inserted in the vacuum chamber 11 from the source gas supply source 41 in a state wherein it keeps a same supplying sectional shape (for example, a circular shape or a substantial square shape) and is connected to the gas supplying end element 22 which has a varying supplying sectional shape in the vacuum chamber 11.

It is to be noted here that, while the gas supplying end element 22 is disposed in the vacuum chamber 11, it may otherwise be disposed outside the vacuum chamber 11 only if a gas supply port 21 which serves as an air outlet of the gas supplying end element 22 is communicated with the inside of the vacuum chamber 11.

In this instance, also the circumference of the gas supplying end element 22 is covered with the heater 17.

The gas supplying end element 22 supplies the source gas together with the carrier gas toward the substrate mounting face 12a of the substrate holder 12. Here, the gas is supplied in an elongated rectangular shape to the substrate mounting face 12a.

Particularly here, as seen in FIG. 1B, the gas supply port 21 of the gas supplying end element 22 has a rectangular opening shape and is formed such that the opening dimension L1 in the longer side direction thereof is greater than the opening dimension W1 in the shorter side direction and is greater than the width L2 of the substrate S to be mounted in a predetermine state on the substrate mounting face 12a.

The opening shape of the gas supplying end element 22 is varied toward the gas supply port 21 having such a shape as just described.

Preferably, the gas supplying end element 22 is formed such that, for example, the opening area C1 of the gas supply port 21 is substantially equal to the supply sectional area C2 of the gas supply pipe 23. Here, the supply sectional area C2 is a cross sectional area of the gas supply pipe 23 on the inner circumferential wall side.

Therefore, for example, as seen in the figure, the gas supplying end element 22 is formed in such a shape that it is gradually expanded toward the opening width L1 in the longer side direction of the gas supply port 21 and is gradually reduced toward the opening dimension W1 in the shorter side direction.

Due to the configuration described above, the source gas is flowed in a uniform pressure from the gas supply pipe 23 to the gas supply port 21 of the gas supplying end element 22 together with the carrier gas.

The gas supplying end element 22 formed in such a manner as described above is disposed such that the gas is supplied in the same direction toward the substrate mounting face 12a therefrom and is disposed further such that the source gas is supplied, for example, in a substantially perpendicular direction toward the substrate mounting face 12a.

It is to be noted that, while it is described here that the source gas is supplied in a substantially perpendicular direction toward the substrate mounting face 12a, the gas supplying end element 22 may otherwise be disposed such that the source gas is supplied in an oblique direction to the substrate mounting face 12a.

Further, the longer side direction of the gas supply port 21 extends substantially perpendicularly to the direction of the sliding movement of the substrate mounting face 12a.

Here, since the substrate mounting face 12a is slidably moved in the direction toward the depth of the drawing as described hereinabove, the longer side direction (wider opening direction) of the gas supply port 21 coincides with the upward and downward direction on the drawing. Further, the shorter side direction of the gas supply port 21 is the depthwise direction on the drawing which is the same direction as the direction of the sliding movement.

Further, since the gas supplying end element 22 is formed such that it exhibits a gradually increasing width toward the opening dimension L1 in the longer side direction of the gas supply port 21 as described hereinabove, the shape in side elevation of the gas supply port 21 as viewed in the direction of the shorter side is formed in a triangular shape whose bottom side is the longer side of the gas supply port 21.

In order to use the organic vapor phase deposition apparatus having such a configuration as described above to form an organic thin film on the surface of a substrate S, the substrate S covered with a mask (not shown) is first mounted on the fixed substrate holder 12 as seen in FIG. 1A.

Thereupon, the substrate S is mounted on the substrate mounting face 12a such that the direction of the dimension L2 of the substrate S coincides with the longer side direction of the gas supply port 21.

Then, the substrate mounting face 12a is slidably moved in the shorter side direction of the gas supply port 21, that is, in the depthwise direction in the drawing, by the sliding mechanism for the substrate holder 12.

Meanwhile, for example, inert gas is introduced as the carrier gas from the pipe 18 connected to the carrier gas supply source 42 into the source gas supply source 41 so that it is mixed with the source gas evaporated by the heater 17.

Then, the source gas mixed with the carrier gas is supplied through the gas supply pipe 23 and then from the gas supplying end element 22 into the vacuum chamber 11 as seen in FIG. 1B. Thereupon, the source gas mixed with the carrier gas is supplied in the direction indicated by an arrow mark A toward the surface of the substrate S mounted on the substrate mounting face 12a.

Meanwhile, since the substrate mounting face 12a slidably moves in the depthwise direction on the drawing, the source gas supplied in an elongated rectangular shape in the upward and downward direction of the substrate S on the drawing is deposited over the overall area of the surface of the substrate S mounted on the substrate mounting face 12a to form an organic thin film.

It is to be noted that, while the example wherein the substrate S is covered with a mask (not shown) is described in the embodiment, the present invention can be applied also where an organic thin film is formed over the overall area of the surface of the substrate S without mounting a mask.

According to the organic vapor phase deposition apparatus having such a configuration as described above, the gas supplying end element 22 is formed such that the gas is supplied in an elongated rectangular shape to the substrate mounting face 12a and besides is formed such that the opening width L1 in the longer side direction of the gas supply port 21 whose opening has a rectangular shape is greater than the dimension L2 of the substrate S mounted in a predetermined state on the substrate mounting face 12a. Therefore, the raw material is supplied in an elongated rectangular shape over the width of the substrate S in accordance with the shape of the gas supply port 21.

Then, since the substrate holder 12 has the sliding mechanism for slidably moving the substrate mounting face 12a in the direction of the shorter side of the gas supply port 21, the source gas supplied in an elongated rectangular shape over the dimension L2 of the substrate S can be supplied to the overall area of the surface of the substrate S. Consequently, the source gas can be deposited uniformly on the surface of the substrate S, and an organic thin film of a uniform thickness can be formed.

Accordingly, an organic thin film of a further uniform film thickness can be formed, and an organic light emitting element layer which is free from irregularity in luminance even where it is applied to a large screen can be formed.

Further, according to the organic vapor phase deposition apparatus of the present embodiment, since the gas supplying end element 22 is disposed such that the source gas is supplied in a substantially perpendicular direction toward the substrate mounting face 12a, where a mask is used to form an organic thin film, a shadow effect can be prevented. Consequently, displacement of a formed film pattern can be prevented.

Furthermore, since the gas supply port 21 is formed such that the opening area C1 thereof is substantially equal to the supply sectional area C2 of the gas supply pipe 23, the source gas from the gas supply pipe 23 flows within the gas supplying end element 22 while maintaining a uniform pressure together with the carrier gas. Therefore, the source gas can be supplied uniformly from different portions of the gas supply port 21 toward the substrate mounting face 12a.

It is to be noted that, while, in the present embodiment, the gas supply port 21 and the gas supply pipe 23 are formed such that the opening area C1 and the supply sectional area C2 are substantially equal to each other, they may be formed otherwise such that the opening area of the gas supply port 21 is a little smaller. In this instance, since a pressure is applied at the gas supply port 21, the source gas can be supplied uniformly from various portions of the gas supply port 21 in a state wherein it is further diffused in the inside of the gas supplying end element 22.

Furthermore, while, in the present embodiment, the sliding mechanism is provided for the substrate holder 12, alternatively a rotating mechanism having an axis of rotation at the center of the substrate mounting face 12a may be provided.

It is to be noted, however, that, according to the organic vapor phase deposition apparatus of the present embodiment, since the source gas is supplied in an elongated rectangular shape over the width of the substrate S as described hereinabove, the sliding mechanism is more preferable because the gas can be supplied uniformly over the overall area of the surface of the substrate S.

Further, while, in the present embodiment, the gas supply port 21 is disposed such that the direction of the longer side thereof coincides with the upward and downward direction on the drawing and the direction of the shorter side thereof coincides with the depthwise direction on the drawing, the gas supply port 21 may otherwise be disposed such that the direction of the longer side thereof coincides with the depthwise direction on the drawing and the direction of the shorter side thereof coincides with the upward and downward direction on the drawing. In this instance, the substrate mounting face 12a is moved in the direction of the shorter side thereof, that is, in the upward and downward direction on the drawing in the plane of the substrate mounting face 12a by the sliding mechanism.

Further, while the gas supply port 21 is formed such that the opening width L1 thereof in the direction of the longer side is greater than the dimension L2 of the substrate S mounted on the substrate mounting face 12a in a predetermined state, the opening width L1 may otherwise be substantially equal to the dimension L2. In this instance, since the source gas is supplied only to the surface of the substrate S, it is possible to deposit the source gas uniformly and efficiently on the surface of the substrate S.

Further, while, in the present embodiment, the opening shape of the gas supply port 21 is a rectangular shape, the present invention is not limited to this, but the opening shape of the gas supply port 21 may otherwise be, for example, an elliptical shape only if the opening of the gas supply port 21 is formed such that the gas is supplied in an elongated rectangular shape to the substrate mounting face 12a. It is to be noted, however, that the opening of the gas supply port 21 preferably has a rectangular shape since the source gas can be supplied uniformly also to end portions of the substrate thereby to assure the uniformity of the source gas to be supplied to the surface of the substrate S.

Furthermore, in the present embodiment, the gas supplying end element 22 has a triangular shape as viewed in side elevation formed such that it gradually increases the width thereof toward the opening width L1 in the longer side direction of the gas supply port 21. However, the present invention is not limited to this, but the gas supplying end element 22 may have any of such shapes as shown in FIGS. 2A to 2C only if it is formed so as to supply the gas in an elongated rectangular shape to the substrate mounting face 12a.

Figure 2A:
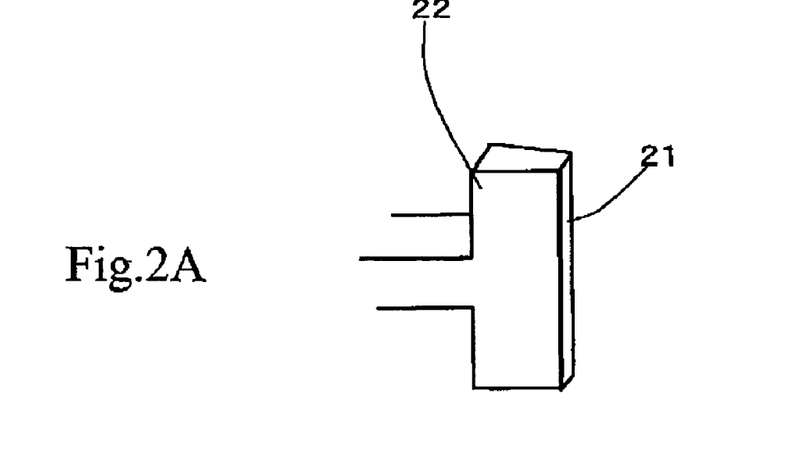
FIGS. 2A to 2C are perspective views showing different examples of a gas supplying end element in the first embodiment.

More particularly, the shape in side elevation of the gas supplying end element 22 as viewed in the direction of the shorter side of the gas supply port 21 may be a rectangular shape expanded in one stage in the direction of the longer side toward the gas supply port 21 as seen in FIG. 2A. Or, the shape in side elevation of the gas supplying end element 22 as viewed in the direction of the shorter side of the gas supply port 21 may be a stepped shape wherein it is expanded stepwise to increase the width in the direction of the longer side toward the gas supply port 21 as seen in FIG. 2B.

Figure 2B:
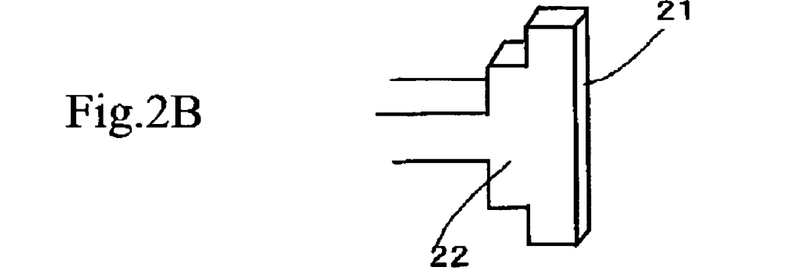
Figure 2C:
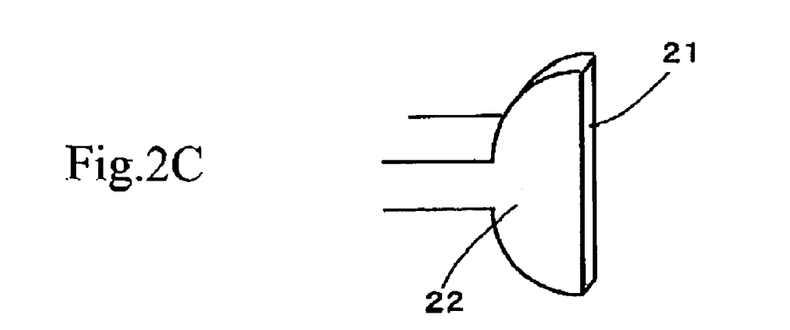

Or else, the shape in side elevation of the gas supplying end element 22 as viewed in the direction of the shorter side of the gas supply port 21 may be a semicircular shape in side elevation formed so as to increase the length in the direction of the longer side toward the gas supply port 21 as seen in FIG. 2C.

Where the shape in side elevation of the gas supplying end element 22 may be any of such rectangular shape, stepped shape and semicircular shape as seen in FIGS. 2A to 2C, since the opposite side walls which form the shorter sides of the gas supply port 21 of the gas supplying end element 22 are provided substantially in parallel to each other, the source gas supplied from the gas supply port 21 is prevented from being diffused in the direction of the longer side and the advancing direction of the source gas can be arranged in the same direction to a higher degree. Accordingly, the source gas can be uniformed between the central portion and the end portions of the surface of the substrate S.

Particularly, if the shape in side elevation of the gas supplying end element 22 is a semicircular shape, then the gas supplying end element 22 does not have a corner portion at which the gas is likely to stay when compared with the alternative case wherein the gas supplying end element 22 is formed in a rectangular or stepped shape in side elevation. Therefore, the gas supplying end element 22 of the semicircular shape in side elevation is more preferable than that of a rectangular shape or a stepped shape.

Further, where the shape in side elevation of the gas supplying end element 22 is a triangular shape as in the present embodiment, for example, if a tubular head extending with the opening shape of the gas supply port 21 is provided, then the side walls on the shorter side of the gas supply port 21 of the gas supplying end element 22 are provided substantially in parallel to each other and can control the advancing direction of the gas so that it may not be widened toward the substrate S. Therefore, the gas supplying end element 22 of the triangular shape in side elevational is preferable. Consequently, similar advantages to those achieved where the gas supplying end element 22 has a semicircular shape as described above can be anticipated.

Second Embodiment

Figure 3A:
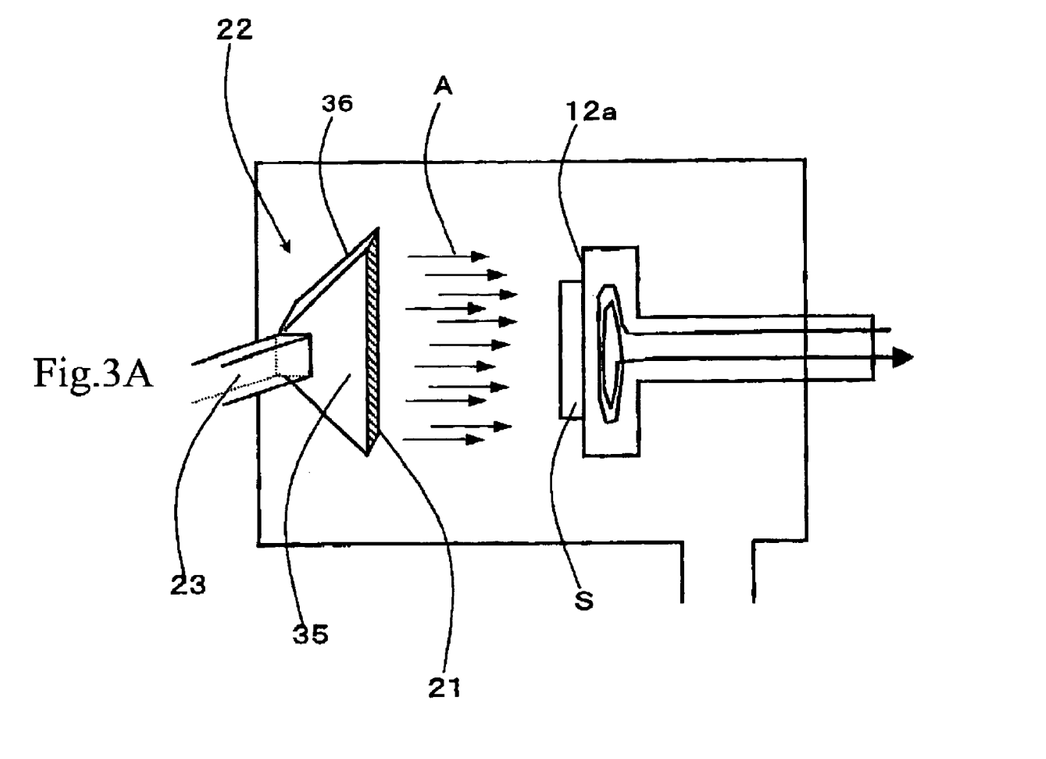
FIG. 3A is a schematic view showing a thin film formation apparatus according to a second embodiment.

In the present embodiment, an example is described wherein the gas supply pipe 23 is connected to the gas supplying end element 22 so that the gas is supplied to the gas supplying end element 22 in a substantially perpendicular direction to the supplying direction of the gas at the gas supplying end element 22 described hereinabove in connection with the first embodiment.

As seen in FIG. 3A, the gas supply pipe 23 is connected substantially perpendicularly to a side wall 35 which forms the longer side of the gas supply port 21 of the gas supplying end element 22 such that it is communicated with the inside of the gas supplying end element 22. More particularly, the gas supply pipe 23 is connected to a portion of the side wall 35 on the base end side of the gas supplying end element 22.

Here, while the side wall 35 is formed in a substantially triangular shape whose bottom side is the longer side of the gas supply port 21, the base end side signifies a portion proximate to the vertex of the triangular shape.

Where such a configuration as described above is employed, the base end side of the gas supplying end element 22 connected to the gas supply pipe 23 in the first embodiment is closed up.

It is to be noted here that, while the gas supply pipe 23 is connected substantially perpendicularly to the side wall 35 of the longer side of the gas supply port 21 of the gas supplying end element 22, the present invention is not limited to this, but only it is necessary for the gas supply pipe 23 to be connected such that the gas is supplied therefrom to the gas supplying end element 22 in a substantially perpendicular direction with respect to the supplying direction of the gas from the gas supplying end element 22. Thus, the gas supply pipe 23 may otherwise be connected to a side wall 36 which forms the shorter side of the gas supply port 21.

Further, while it is described that the gas supply pipe 23 is connected to the side wall 35 on the base end side of the gas supplying end element 22, the present invention is not limited to this, but the gas supply pipe 23 may otherwise be connected to a portion of the side wall 35 rather near to the center of the side wall 35.

Figure 3B:
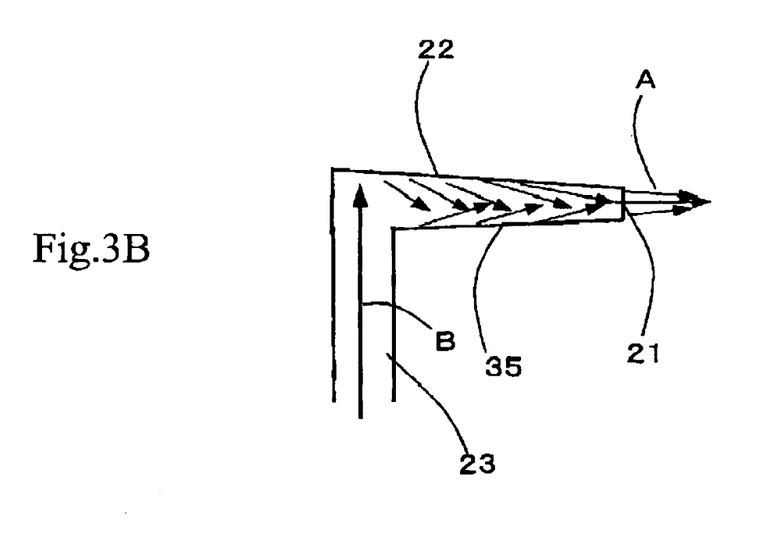
FIG. 3B is a partial enlarged view of the thin film formation apparatus.

It is to be noted, however, that, in order to diffuse the source gas efficiently in the inside of the gas supplying end element 22, preferably the gas supply pipe 23 is disposed substantially perpendicularly to the side wall 35 on the longer side of the gas supply port 21, and preferably, the gas supply pipe 23 is disposed on the base end side of the gas supplying end element 22 on the side wall 35.

Where such a configuration as described above is employed, the source gas is introduced into the inside of the gas supplying end element 22 through the gas supply pipe 23 as indicated by an arrow mark B in a partial enlarged top plan view of the gas supplying end element 22 and the gas supply pipe 23 of FIG. 3B. Then, after the source gas collides with an inner side wall opposing to the side wall 35, it is supplied in a state diffused in the inside of the gas supplying end element 22 in a substantially perpendicular direction (arrow mark A) toward the substrate mounting face 12a (refer to FIG. 3A) from the gas supply port 21.

According to the organic vapor phase deposition apparatus having such a configuration as described above, similar advantages to those of the first embodiment can be anticipated. Besides, since the gas supply pipe 23 is connected to the gas supplying end element 22 such that the gas is supplied therefrom to the gas supplying end element 22 in a substantially perpendicular direction to the supplying direction of the source gas from the gas supplying end element 22, the source gas from the gas supply pipe 23 collides with the inner side wall of the gas supplying end element 22. Consequently, the source gas in a state wherein it is diffused sufficiently in the inside of the gas supplying end element 22 can be supplied uniformly in an elongated rectangular shape toward the substrate mounting face 12a.

Accordingly, an organic thin film having a film thickness of a higher degree of uniformity can be formed, and an organic light emitting element layer which does not exhibit irregularity in luminance even where it is applied to a large screen can be formed.

Further, according to the present embodiment, the gas supply pipe 23 is connected substantially perpendicularly to the side wall 35 which forms a longer side of the gas supply port of the gas supplying end element 22 and besides is connected to the side wall 35 on the base end side of the gas supplying end element 22. Therefore, the source gas can be diffused efficiently in the inside of the gas supplying end element 22 and supplied from the gas supply port 21.

It is to be noted here that, while an example where the shape in side elevation of the gas supplying end element 22 is a triangular shape is described, the present invention is not limited to this, but can be applied also to any of such shapes in side elevational as shown in FIGS. 2A to 2C.

Third Embodiment

Figure 4:
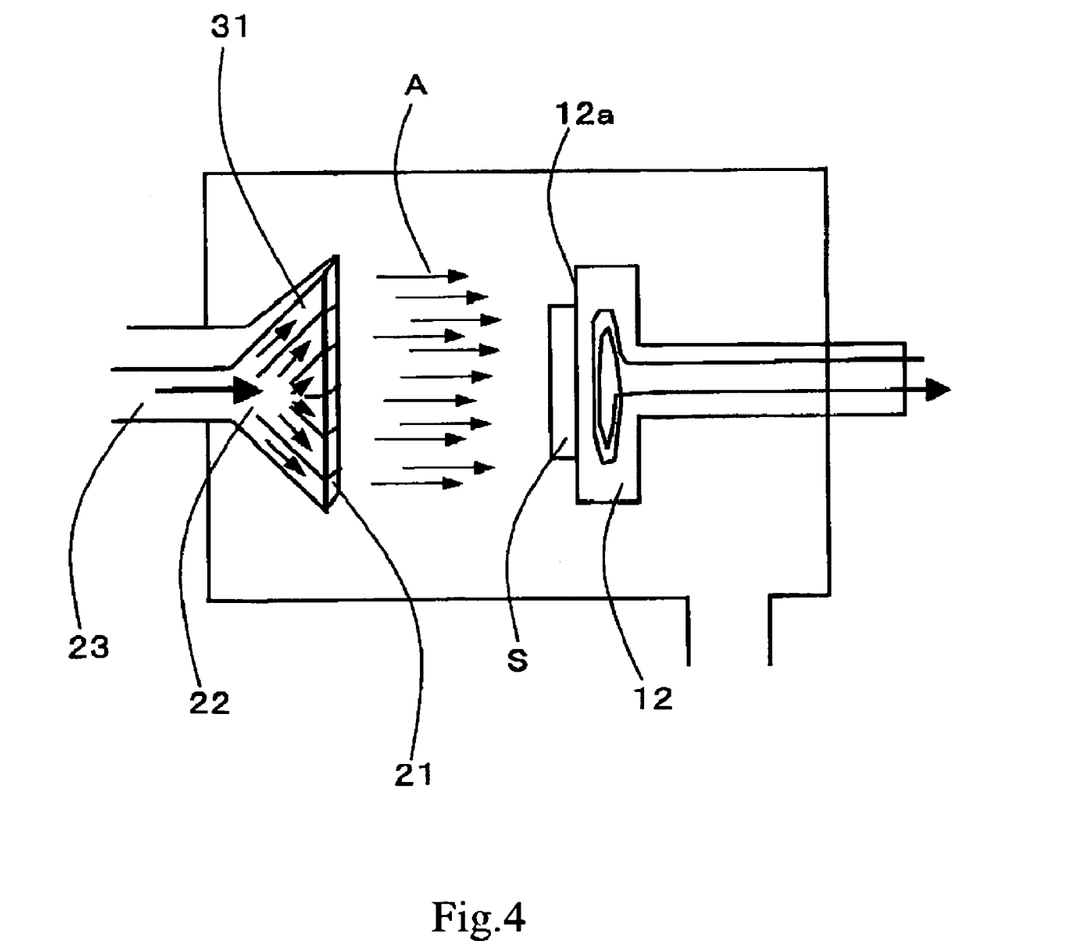
FIG. 4 is a partial enlarged view showing a thin film formation apparatus according to a third embodiment.

In the present embodiment, an example wherein the gas supplying end element 22 in the first embodiment is divided into a plurality of gas flow paths 31.

As seen in FIG. 4, the gas supplying end element 22 in the present embodiment includes, for example, six gas flow paths 31 provided therein. The gas flow paths 31 are separated from each other toward the gas supplying direction and extend to the gas supply port 21.

The gas flow paths 31 are disposed along the direction of the longer side of the gas supply port 21.

Here, the gas supply port 21 to which the six gas flow paths 31 extend are formed in a uniformly divided state so that, for example, the opening areas thereof may be equal to one another.

Where such a configuration as described above is employed, the source gas is distributed in the six gas flow paths 31 through the gas supply pipe 23 and is supplied in a substantially vertical direction (arrow mark A) from the divisional gas supply port 21 toward the substrate mounting face 12a.

According to the organic vapor phase deposition apparatus having such a configuration as described above, similar advantages to those of the first embodiment can be anticipated. In addition, since the gas supplying end element 22 includes the plural gas flow paths 31 divided toward the gas supplying direction in the inside thereof and extending to the gas supply port 21, the gas coming to the gas supplying end element 22 is distributed in the direction of the longer side by the gas flow paths 31.

Therefore, the source gas can be supplied not as turbulent flows but as a uniform laminar flow having the directionality along the gas flow paths 31 in an elongated rectangular shape from the divisional gas supply port 21 to the substrate mounting face 12a. Consequently, the distribution of the source gas to be supplied to the surface of the substrate S can be controlled to a higher degree of uniformity.

Accordingly, an organic thin film of a film thickness having a higher degree of uniformity can be formed, and an organic light emitting element layer which does not exhibit irregularity in luminance even where it is applied to a large screen can be formed.

It is to be noted here that, while an example where the shape in side elevation of the gas supplying end element 22 is a triangular shape is described, the present invention is not limited to this, but can be applied also to any of such shapes in side elevational as shown in FIGS. 2A to 2C.

Figure 5A:
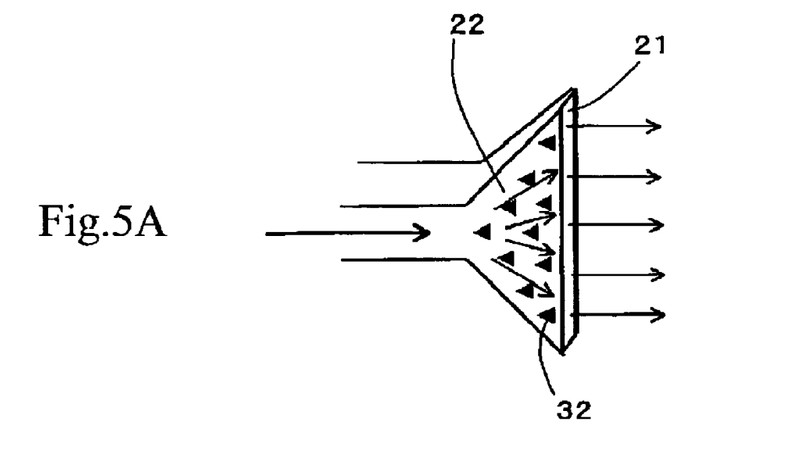
FIGS. 5A to 5C are perspective views showing different examples of a gas supplying end element in the third embodiment.
Figure 5B:
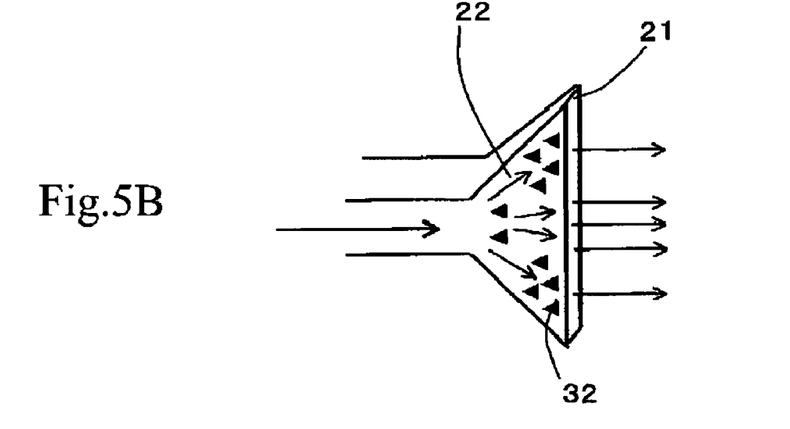
Figure 5C:
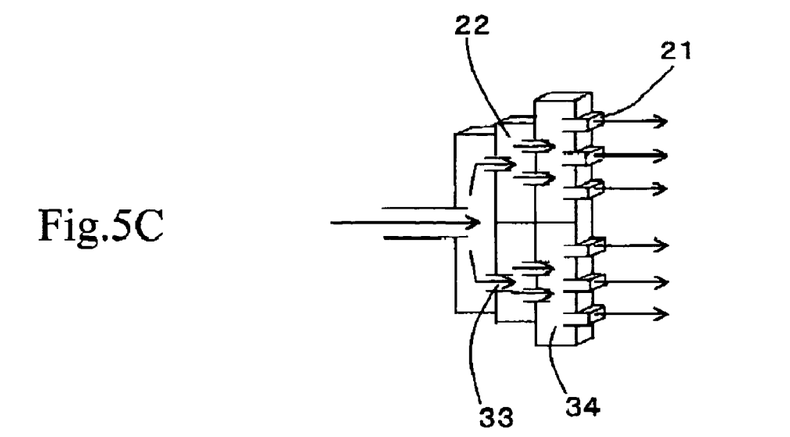

Further, while, in the description of the present embodiment, an example is described wherein a plurality of gas flow paths 31 are provided in the inside of the gas supplying end element 22, the present invention is not limited to this, but the gas supplying end element 22 may have any of such shapes as seen in FIGS. 5A to 5C only if the gas supplying end element 22 is shaped such that it is divided in the inside thereof so that the gas may be supplied uniformly in an elongated rectangular shape to the substrate mounting face 12a.

For example, if prism-shaped diffusion walls 32 are disposed in the inside of the gas supplying end element 22 as shown in FIG. 5A, then the gas can be distributed uniformly in the longer side direction of the gas supply port 21 in the inside of the gas supplying end element 22. Consequently, the gas can be supplied uniformly in an elongated rectangular shape to the surface of the substrate S.

The shape of the diffusion walls 32 is not limited to the prism shape, but may be any of a circular column shape, an elliptic column shape and a rectangular column shape only if the gas can be distributed uniformly in the direction of the longer side of the gas supply port 21 in the inside of the gas supplying end element 22.

More preferably, the arrangement pattern of the diffusing walls is formed in an optimized arrangement pattern so that the source gas may be supplied uniformly in an elongated rectangular shape to the surface of the substrate S.

For example, if the film thickness distribution when an organic thin film is formed on the surface of the substrate S in advance exhibits a smaller thickness at a central portion than at end portions of the substrate, then the arrangement pattern of the diffusion walls 32 in the inside of the gas supplying end element 22 may be formed such that the diffusion walls 32 may be concentrated at the end portions of the gas supplying end element 22 so that the gas may be supplied by a greater amount to the central portion.

Further, the gas supplying end element 22 may include a plurality of gas flow paths 33 divided stepwise in the upward and downward direction on the drawing toward the supplying direction of the gas while each of the gas flow paths 33 has a plurality of diffusion chambers 34 for diffusing the gas as seen in FIG. 5C. Here, the gas is supplied from, for example, six gas supply ports 21 disposed at the diffusion chamber 34 as a final stage of the diffusion chambers in the upward and downward direction on the drawing. Also where such a shape as just described is used, the gas can be supplied in an elongated rectangular shape to the surface of the substrate S and besides can be supplied uniformly in a state wherein it is diffused sufficiently in the inside of the gas supplying end element 22.

Fourth Embodiment

Figure 6:
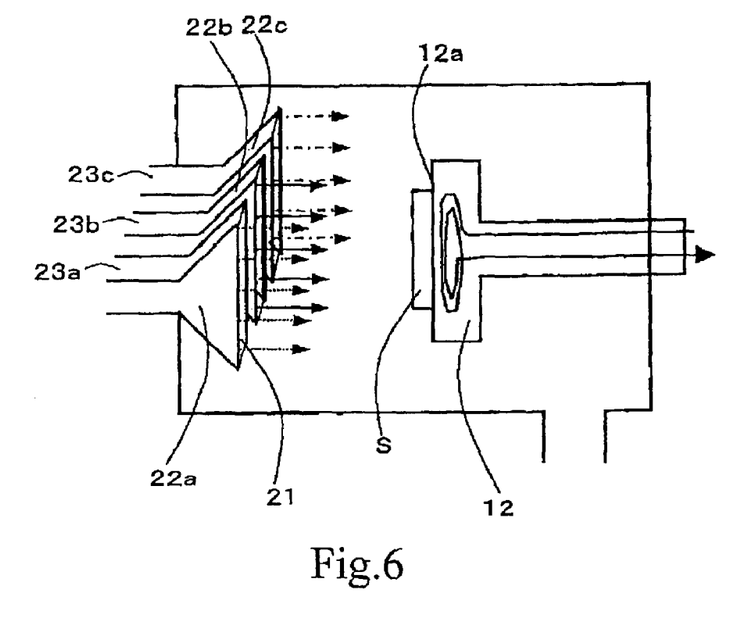
FIG. 6 is a partial enlarged view showing a thin film formation apparatus according to a fourth embodiment.

In the present embodiment, an example which includes a plurality of such gas supplying end elements 22 as described hereinabove in connection with the first embodiment is described above.

As seen in FIG. 6, the organic vapor phase deposition apparatus in the present embodiment includes, for example, three gas supply pipes 23a to 23c. The gas supply pipes 23a to 23c are inserted in the vacuum chamber 11 and connected to corresponding gas supplying end elements 22a to 22c, respectively.

The gas supplying end elements 22a to 22c are disposed in a juxtaposed relationship in the direction of the shorter side of the gas supply port 21, that is, in the depthwise direction on the drawing and in an opposing relationship to the substrate mounting face 12a.

Further, the gas supply pipes 23a to 23c are individually connected to a source gas supply source 41 (refer to FIG. 1A).

While the plural gas supply pipes 23a to 23c here are connected to the source gas supply source 41, otherwise a plurality of source gas supply sources 41 may be provided in a corresponding relationship to the gas supply pipes 23a to 23c.

The gas supply pipes 23a to 23c have gas flow rate control apparatus (not shown) which are independent of one another, and not only the flow rates of the gas can be adjusted but also the flow rages can be reduced to 0 by operating the gas flow rate control apparatus.

Accordingly, where different types of source gas are introduced into the gas supply pipes 23a to 23c, also it is possible to change over the types of the source gas.

According to the organic vapor phase deposition apparatus having such a configuration as just described, similar advantages to those of the first embodiment can be anticipated. In addition, since the gas supplying end elements 22a to 22c are juxtaposed in the direction of the shorter side of the gas supply port 21 and the gas is supplied in an elongated rectangular shape over the width of the substrate S from the respective gas supplying end elements 22, the source gas can be supplied to the overall area of the surface of the substrate S.

Further, since the gas flow rate control apparatus are provided individually for the gas supply pipes 23a to 23c, if the gas flow rate control apparatus are adjusted in accordance with a film thickness of an organic thin film to be formed, then an organic thin film having a uniform film thickness can be formed.

In this instance, even if the sliding mechanism for moving the substrate mounting face 12a in the direction of the shorter side of the gas supply port 21 is not provided for the substrate holder 12, the source gas can be deposited uniformly on the surface of the substrate S, and an organic thin film of a uniform thickness can be formed.

Accordingly, even if the sliding mechanism is not provided for the substrate holder 12, an organic thin film of a high quality can be formed at a low cost, and an organic light emitting element layer which does not exhibit irregularity in luminance even where it is applied to a large screen can be formed.

While, in the present embodiment, an example wherein the same type of source gas is supplied from the gas supplying end elements 22a to 22c is described, different types of source gas may otherwise be supplied from the gas supplying end elements 22a to 22c.

In this instance, the gas supply pipes 23a to 23c are individually connected to different ones of the source gas supply sources 41 from one another. Then, if the substrate mounting face 12a is moved in the depthwise direction by the sliding mechanism, then a layered film of organic thin films wherein the source gases supplied from the gas supplying end elements 22a to 22c are successively deposited can be formed on the surface of the substrate S, and each of the layers can be formed with a uniform film thickness. Further, an organic thin film doped with a different type of raw material can be formed with a uniform film thickness on the surface of the substrate S.

It is to be noted here that, while an example wherein the shape in side elevation of the gas supplying end element 22 is a triangular shape is described, the present invention is not limited to this but can be applied also to any of such shapes in side elevation as shown, for example, in FIGS. 2A to 2C.

According to the thin film formation apparatus having such a configuration as described above, since the gas supplying end element is formed so as to supply the gas in an elongated rectangular shape to the substrate mounting face, the gas can be supplied in an elongated rectangular shape to the surface of a substrate mounted on the substrate mounting face.

Further, if a sliding mechanism for moving the substrate holder in the direction of the shorter side within the supplying range of the gas having an elongated rectangular shape is provided, then by slidably moving the substrate mounting face in the direction of the shorter side when the gas is supplied, the gas supplied in an elongated rectangular shape can be supplied while it is scanned in the direction of the shorter side on the surface of the substrate. Consequently, gas formed from film formation components can be deposited uniformly in the surface region of the substrate, and a thin film having a uniform film thickness can be formed.

Further, where a plurality of gas supply ports are juxtaposed in the direction of the shorter side within the gas supplying range, the gas supplied in an elongated rectangular shape from the gas supply ports can be supplied over the shorter side direction. Consequently, even where the substrate remains in a stationary state, gas formed from film formation components can be deposited uniformly in the surface region of the substrate and a thin film having a uniform film thickness can be formed.

Accordingly, where the thin film formation apparatus is applied to formation of an organic EL display device, an organic light emitting element layer which does not exhibit irregularity in luminance even where it is applied to a large screen can be formed.

What is claimed is:

1. A thin film formation apparatus which includes a vacuum chamber, a substrate holder provided in said vacuum chamber, and a gas supplying end element for supplying gas toward a substrate mounting face of said substrate holder, characterized in that said gas supplying end element has a source end and an output end, and wherein the output end consists of a rectangular gas supply port having a longer major axis and a shorter minor axis, said gas supplying end element being formed in such a way that the distance between opposing side-walls along the major axis decreases in a direction of gas flow from the source end to the output end of the gas supplying end element, and a distance between opposing side-walls along the minor axis increase in a direction of gas flow from the source end to the output end of the gas supplying end element.

2. A thin film formation apparatus according to claim 1, characterized in that said gas supplying end element is formed so as to supply the gas in an elongated rectangular shape over a width of a substrate mounted on said substrate mounting face.

3. A thin film formation apparatus according to claim 1, characterized in that said substrate holder includes a sliding mechanism for moving said substrate mounting face of said substrate holder in a direction of a shorter side of the supplying range of the gas which has the elongated rectangular shape.

4. A thin film formation apparatus according to claim 1, characterized in that a plurality of gas supplying end elements are disposed parallel in a direction of a shorter side of the supplying range of the gas which has the elongated rectangular shape.

5. A thin film formation apparatus according to claim 4, characterized in that different types of gas from each other are supplied from said plural gas supplying end elements.

6. A thin film formation apparatus according to claim 4, characterized in that a single kind of gas is supplied from said plural gas supplying end elements.

7. A thin film formation apparatus according to claim 1, characterized in that said gas supplying end element includes a plurality of gas flow paths divided toward the gas supplying direction in the inside of said gas supplying end element and extending to a gas supply port of said gas supplying end element.

8. A thin film formation apparatus according to claim 1, characterized in that said gas supplying end element is formed so as to supply the gas substantially perpendicularly toward said substrate mounting face.

9. A thin film formation apparatus according to claim 1, characterized in that a gas supply port of said gas supplying end element is formed in such a manner as to have an opening area substantially equal to or smaller than a supplying sectional area of a gas supply pipe for supplying gas to said gas supplying end element.

10. A thin film formation apparatus according to claim 1, characterized in that a gas supplying pipe is connected to said gas supplying end element so as to supply the gas to said gas supplying end element from a direction substantially perpendicular to the supplying direction of the gas from said gas supplying end element.

* * * * *